(12) United States Patent
Yang

(10) Patent No.: US 7,884,465 B2
(45) Date of Patent: Feb. 8, 2011

(54) SEMICONDUCTOR PACKAGE WITH PASSIVE ELEMENTS EMBEDDED WITHIN A SEMICONDUCTOR CHIP

(75) Inventor: Seung Taek Yang, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 98 days.

(21) Appl. No.: 11/778,149

(22) Filed: Jul. 16, 2007

(65) Prior Publication Data

US 2008/0315416 A1    Dec. 25, 2008

(30) Foreign Application Priority Data

Jun. 20, 2007    (KR) .................... 10-2007-0060262

(51) Int. Cl.
*H01L 23/04* (2006.01)
(52) U.S. Cl. ...................... 257/698; 257/773
(58) Field of Classification Search .............. 257/773, 257/698, 724, 774
See application file for complete search history.

(56) References Cited

U.S. PATENT DOCUMENTS 7,132,311 B2 * 11/2006 Akiba et al. ............. 438/109

| | | | |
|---|---|---|---|
| 2004/0113752 A1 * | 6/2004 | Schuster | 338/310 |
| 2005/0224989 A1 * | 10/2005 | Myers et al. | 257/774 |
| 2006/0118931 A1 * | 6/2006 | Ho et al. | 257/678 |
| 2008/0054444 A1 * | 3/2008 | Tuttle | 257/698 |

FOREIGN PATENT DOCUMENTS

| | | |
|---|---|---|
| JP | 2003-060153 A | 2/2003 |
| JP | 2004-128219 A | 4/2004 |
| KR | 100485111 B1 | 2/2004 |
| KR | 1020080001395 A | 1/2008 |

* cited by examiner

*Primary Examiner*—Wael M Fahmy
*Assistant Examiner*—Mark W Tornow
(74) *Attorney, Agent, or Firm*—Ladas & Parry LLP

(57) ABSTRACT

A semiconductor package includes a semiconductor chip having bonding pads formed on a top surface and a first via hole and a second via hole formed on both-side edges; a passive element formed within the first via hole; a via wiring formed within the second via hole; a first wiring connected to the bonding pad at one end and connected to the passive element and the via wiring on a top surface of the semiconductor chip; a second wiring formed on a back surface of the semiconductor chip and formed to connect with the passive element and the via wiring; a first passivation film formed in such a way to expose one portion of the first wiring on a top surface of the semiconductor chip; and a second passivation film formed in such a way to expose one portion of the second wiring on a bottom surface of the semiconductor chip.

16 Claims, 5 Drawing Sheets

SEMICONDUCTOR PACKAGE WITH PASSIVE ELEMENTS EMBEDDED WITHIN A SEMICONDUCTOR CHIP

CROSS-REFERENCE TO RELATED APPLICATIONS

The present application claims priority to Korean patent application number 10-2007-0060262 filed on Jun. 20, 2007, which is incorporated herein by reference in its entirety.

BACKGROUND OF THE INVENTION

The present invention relates to a semiconductor package, and more particularly to a semiconductor package with passive elements embedded within a semiconductor chip.

With respect to light, slim, short, and small electronics such as a notebook computer, a mobile phone, and a PDA, it is required to compact the semiconductor package mounted on a related component, i.e., a printed circuit board (hereinafter, "PCB").

The semiconductor package is generally structured in such a way that at least one semiconductor chip is loaded. In order to implement specific electronic circuits set using the semiconductor package, it is necessary to mount such semiconductor package and various passive elements needed to transfer signal without characteristics degradation. The passive elements are exemplified as a resistor R, an inductor L, and a capacitor C, which can be mounted on PCB with the semiconductor package mounted thereon.

Since the passive elements that are necessary to prevent deterioration of the signal characteristics are mounted on the PCB, there is a problem that the total area of the PCB is unnecessarily enlarged, which hinders the compactness of the product. Moreover, since the passive elements are directly mounted on the PCB, there is a problem that lengthening of the signal line can cause a delay in signal transfer. Additionally, there is a problem that a noise can be inserted while transferring the signal, whereby prevention of the deterioration of the signal characteristic is limited. Generally, the passive elements occupy the circuit at a weight of about 80 percent, and the passive elements occupy about 50 percent of the total size of the printed circuit board. Therefore, the passive elements greatly influence cost, size and reliability of the electronic machines.

There has been research conducted on a technology for an embedded-type passive element in which the passive elements are embedded in a multi-layered printed circuit board, as an approach to allow various components to be integrated as one module or as an approach to improve mounting density. This method does not require that each of components be compacted separately.

The technology for implementing the embedded passive element includes a System on Chip (SoC) in which the passive elements are integrally formed with the semiconductor chip and a System in Package in which functional elements are embedded in a package form.

Since the semiconductor package having passive elements must form multiple metal wirings to form the passive elements within the semiconductor chip, there are problems in that the process becomes complicated, and the semiconductor chip deteriorates due to heat.

BRIEF SUMMARY OF THE INVENTION

Embodiments of the present invention are directed to a semiconductor package with passive elements embedded within a semiconductor chip.

Further, embodiments of the present invention provide a semiconductor package that can provide both compactness and superior electric characteristics by embedding the passive elements within the semiconductor chip.

According to one embodiment of the present invention, a semiconductor package may comprise a semiconductor chip having a plurality of bonding pads formed on a top surface and a first via hole and a second via hole formed on edges thereof; a passive element formed within the first via hole; a via wiring formed within the second via hole; a first wiring connected to the bonding pad on a top surface of the semiconductor chip at one end and connected to the passive element and the via wiring on the top surfaces thereof; a second wiring formed on a bottom surface of the semiconductor chip and connected to the passive element and the via wiring on the bottom surfaces thereof; a first passivation film formed in such a way to expose one portion of the first wiring on a top surface of the semiconductor chip and to expose the via wiring; and a second passivation film formed in such a way to expose one portion of the second wiring on a bottom surface of the semiconductor chip and to expose the via wiring.

The second via hole is disposed outward of the first via hole.

The first via hole formed with the passive element and the second via hole formed with the via pattern are formed at least one, respectively.

The passive element formed within at least one first via hole is composed of a dielectric material and a wiring material disposed on both sides of the dielectric material.

The dielectric material of the passive element formed within the at least one first via hole is formed with a different thickness.

The dielectric material is formed with a single film or at least two laminated films.

The semiconductor package further comprises a connection terminal formed to contact with the exposed portion of the first wiring within the first passivation film.

The semiconductor package further comprises a substrate attached to the semiconductor chip formed at the connection terminal.

The semiconductor package further comprises a solder ball attached on a bottom surface of the substrate.

The semiconductor package further comprises a capping film formed on a top portion of the semiconductor chip.

According to another embodiment of the present invention, a semiconductor package with at least two package units being stacked comprises a semiconductor chip having a plurality of bonding pads formed on a top surface and a first via hole and a second via hole formed on edges thereof; a passive element formed within the first via hole; a via wiring formed within the second via hole; a first wiring connected to the bonding pad on a top surface of the semiconductor chip at one end and connected to the passive element and the via wiring on top surfaces thereof; a second wiring formed on a bottom surface of the semiconductor chip and connected to the passive element and the via wiring on the bottom surfaces thereof; a first passivation film formed in such a way to expose one portion of the first wiring on a top surface of the semiconductor chip and to expose the via wiring; a second passivation film formed in such a way to expose one portion of the second wiring on a bottom surface of the semiconductor chip and to expose the via wiring; and a connection terminal formed on the exposed portions of the first wiring and the second wiring.

The second via hole is disposed outward of the first via hole.

The first via hole formed with the passive element and the second via hole formed with the via pattern are formed at least one, respectively.

The passive element formed within at least one first via hole is composed of a dielectric material and a wiring material disposed on both sides of the dielectric material.

The dielectric material of the passive element formed within the at least one first via hole is formed with a different thickness.

The dielectric material is formed with a single film or at least two laminated films.

The semiconductor package further comprises a substrate attached to the semiconductor chip formed at the connection terminal.

The semiconductor package further comprises a solder ball attached on a bottom surface of the substrate.

The semiconductor package further comprises a capping film formed on a top portion of the semiconductor chip.

DESCRIPTION OF SPECIFIC EMBODIMENTS

The embodiment of the present invention forms a semiconductor package with passive elements embedded in such a way that at least one via hole is formed within a semiconductor chip, a dielectric material is formed within the via hole, and a rewiring is formed up and down the dielectric material to fill the via hole.

The present invention can simplify the process by forming the passive elements within the semiconductor chip instead of forming the passive elements having multi-layer metal wiring structure, and can solve reliability degradation of the semiconductor caused by heat generated during the production procedure. Further, the present invention can implement a semiconductor package with optimal electric signal characteristics by embedding the passive elements within the semiconductor chip.

Hereinafter, a semiconductor package having embedded-type passive elements according to the present invention will be specifically described.

Figure 1:
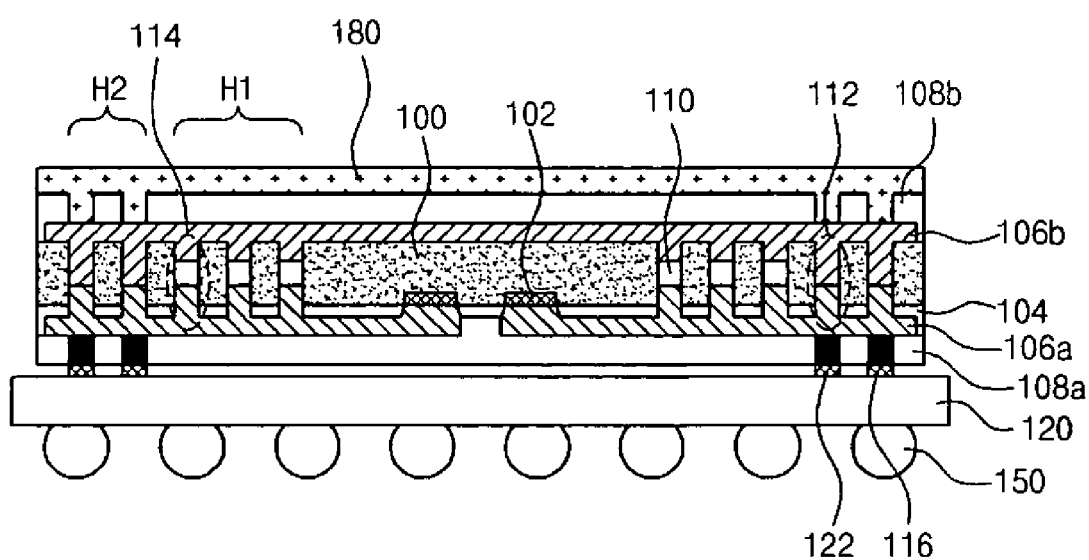
FIG. 1 is a cross-sectional view illustrating a semiconductor package in accordance with one embodiment of the present invention.

FIG. 1 is a cross-sectional view illustrating a semiconductor package according to an embodiment of the present invention.

As shown in FIG. 1, the semiconductor chip 100 has a plurality of bonding pads 102 arranged in a center portion of a top surface thereof. The semiconductor chip 100 has a first via hole H1 formed with a passive element 114 including a dielectric material 110 therein and a second via hole H2 formed with a via pattern 112 which is disposed outward of the first via hole H1, on edges thereof. The semiconductor chip 100 has a first wiring 106a connected to the bonding pad 102 at one end and connected to a top surface of the dielectric material 110 and the via wiring 112 on a top surface thereof, and a second wiring 106b connected to a bottom surface of the dielectric material 110 and connected to the via wiring 112 on a bottom surface thereof. A first and second passivation films 108a, 108b are formed in such a way to expose one portion of the top surface of the first and second wirings 106a, 106b on a top surface and a bottom surface of the semiconductor chip 100 including the first and second wirings 106a, 106b and the via wiring 112. The edge portions of the first and second wirings 106a, 106b are surrounded by the first and second passivation films 108a, 108b. A drawing reference 104 refers to an insulating film.

There are at least one first and second via holes H1, H2. The passive element 114 is formed within the at least one first via hole H1. The passive element 114 includes a dielectric material 110 formed within the first via hole H1 and a first wiring material 106a and a second wiring material 106b formed on a top surface and a bottom surface of the dielectric material. The dielectric material 110 included in the passive element 114 is formed with a single film or at least two laminated films. Further, the dielectric material 110 formed in each of the first holes H1 may be of same thickness or different thickness.

The first and second wirings 106a, 106b and the via wiring 112 are formed with any one of Sn, Ni, Al, Cu and Au, or alloy material thereof.

A connection terminal 116 is formed on the first wiring 106a exposed to the first passivation film 108a on the top surface of the semiconductor chip 100. Consequently, the semiconductor chip 100 has the connection terminal 116 and the connection pad 122 attached to correspond to each other on a substrate 120 with the connection pad 122 equipped on a top surface thereof. A capping film 180 is formed on a top portion of the semiconductor chip 100 attached on the substrate 120 to insulate and protect the semiconductor chip, and a solder ball 150 is attached on a bottom surface of the substrate 120.

Meanwhile, the semiconductor package may be composed in such a way to form an encapsulant (not shown) on the substrate 120 to surround the semiconductor chip 100 instead of the capping film 180.

As such, since the present invention composes the semiconductor package by embedding the passive material within the semiconductor chip, it is possible to make semiconductor package more compact. Further, since the present invention can prevent reliability degradation of the semiconductor chip caused by heat generated during production procedure, it is possible to provide a semiconductor package having optimal electric signal characteristics.

Hereinafter, a method for manufacturing a semiconductor package according to the present invention will be specifically described referring to FIG. 2A through 2F.

Figure 2A:
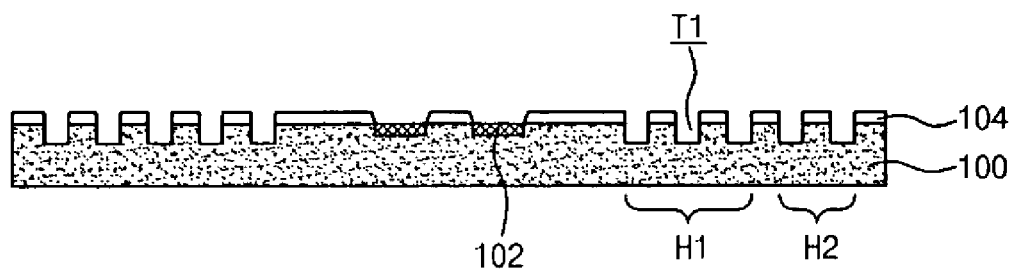
FIGS. 2A through 2F are cross-sectional views illustrating the process steps of a method for manufacturing the semiconductor package in accordance with an embodiment of the present invention.

Referring to FIG. 2A, a semiconductor chip 100 is prepared having a plurality of bonding pads 102 formed in a center portion and first and second via hole H1, H2 forming areas at the edges, and a plurality of first grooves T is formed with certain depth on the first and second via hole H1, H2 forming areas of the semiconductor chip 100. The first and second via hole H1, H2 forming areas refer to areas where a passive element and the via pattern are formed respectively. The second via hole H2 forming area is disposed outward of the first via hole H1 forming area, and there is at least one first and second via hole H1, H2 forming areas in the semiconductor chip 100.

Figure 2B:
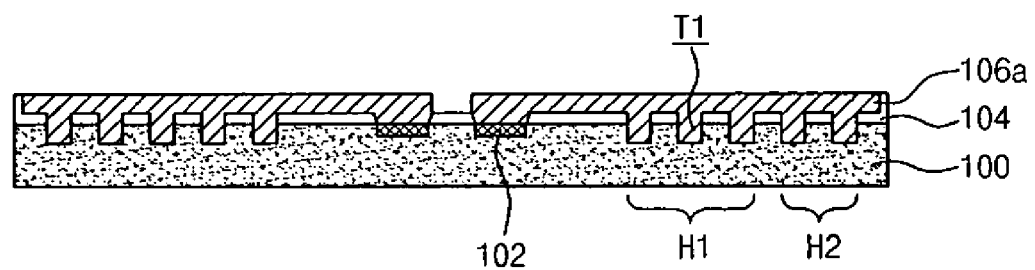

Referring to FIG. 2B, a first wiring 106a is formed on a top surface of the semiconductor chip 100 to fill the first grooves T1, and to connect with the bonding pad 102 at one end thereof. The first wiring 106a may be formed with any one of Sn, Ni, Al, Cu and Au or alloy thereof.

Figure 2C:
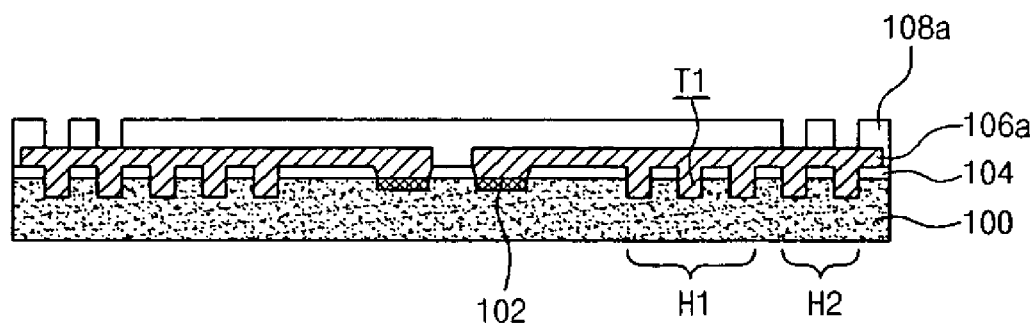

Referring to FIG. 2C, a first passivation film 108a is formed on a top surface of the semiconductor chip 100 including the first wiring 106a in such a way to expose one portion of the first wiring 106a, for example, the edge portion.

Figure 2D:
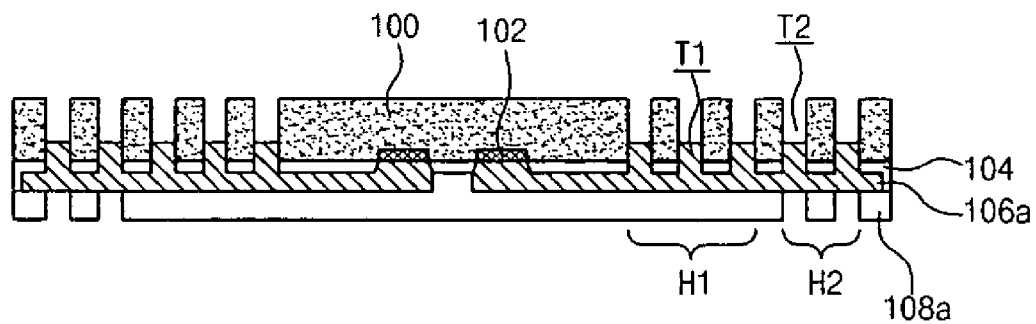

Referring to FIG. 2D, a second groove T2 is formed in such a way to expose the first wiring 106a formed within the first groove T1 by etching a bottom surface of the semiconductor chip 100.

Figure 2E:
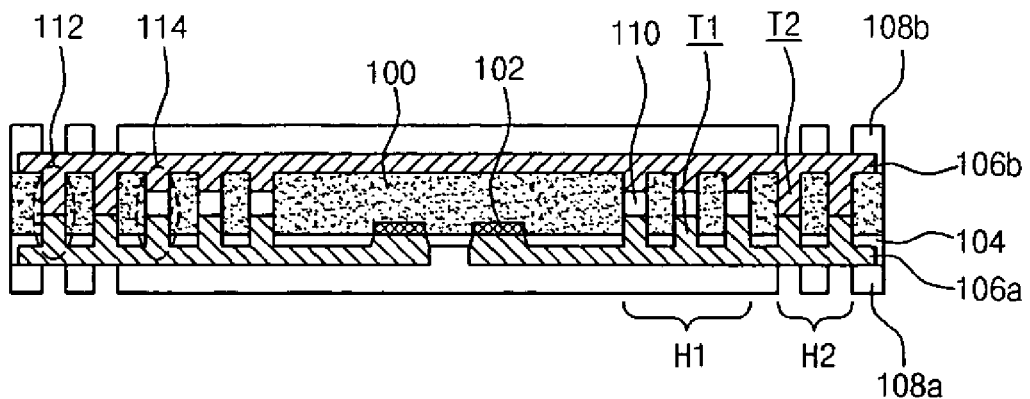

Referring to FIG. 2E, a dielectric material 110 is formed within the second groove T2. The dielectric material 100 is formed with a single film or at least two laminated films. In a case of the dielectric material 100 having at least two laminated films, the films may have same thickness or different thickness within each first via hole H1 configured by which the first grooves T1 and the second grooves T2 are connected.

A second wiring 106b is formed on a bottom surface of the semiconductor 100 to fill the second grooves T2 of the first via hole H1 forming area and the second via hole H2 forming area in which the dielectric material 110 is formed. As a result, the passive element 114 composed of the first wiring material, the dielectric material and the second wiring material is formed within the first via hole H1. The via wiring 112, composed of the first and second wiring materials, is formed within the second via hole H2. The second wiring 106b is formed with any one of Sn, Ni, Al, Cu and Au or alloy thereof. A second passivation film 108b is formed on a bottom surface of the semiconductor chip 100 including the second wiring 106b in a way to expose one portion of the second wiring 106b, for example, edge portion.

Figure 2F:
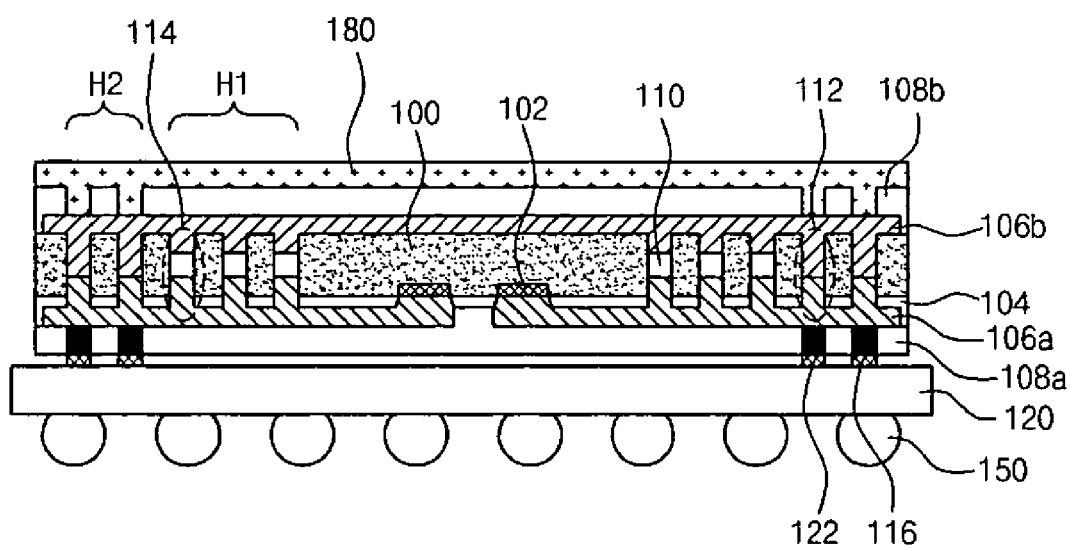

Referring to FIG. 2F, a connection terminal 116 is formed on the exposed portion of the first wiring 106b of the top surface of the semiconductor chip 100. Then, the semiconductor chip 100 is attached on the substrate 120 with the connection pad 122 so that the connection terminal 116 may correspond to the connection pad 122. The connection terminal 116 can be formed with a solder bump or conductive pin. The capping film 160 is formed on a bottom surface of the semiconductor chip 100 and a solder ball 150 is attached on a bottom surface of the semiconductor chip 120 to function as an external connection terminal, thereby complete manufacturing the semiconductor package according to an embodiment of the present invention.

The method for manufacturing the semiconductor package according to an embodiment of the present invention is conducted in a wafer level or a chip level.

According to the present invention, considering the semiconductor chip with the passive element formed therein as the package unit, it is possible to form stack-type semiconductor package by stacking at least two package units.

Figure 3:
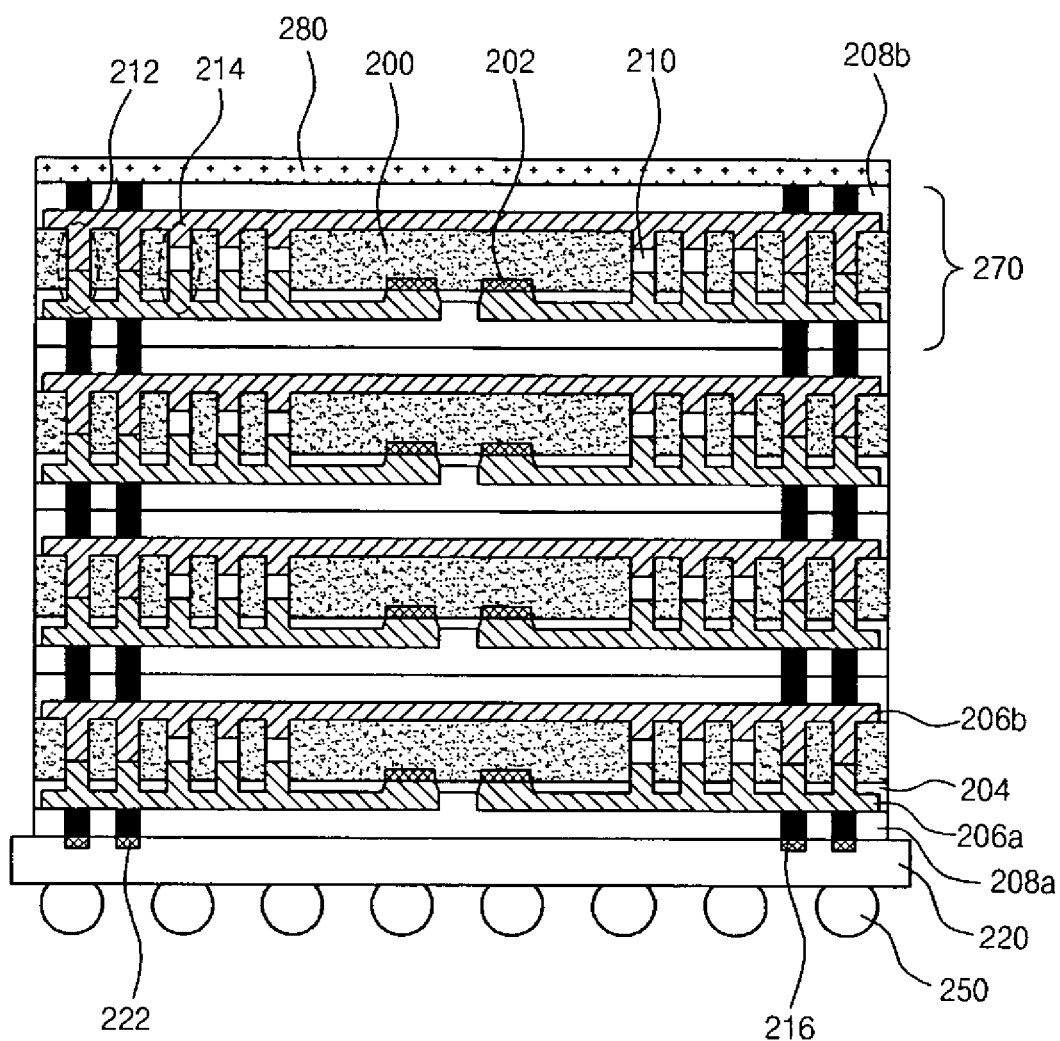
FIG. 3 is a cross-sectional view illustrating a stack-type semiconductor package in accordance with another embodiment of the present invention.

FIG. 3 is a cross-sectional view illustrating the stack-type semiconductor package according to another embodiment of the present invention.

As shown, the stack-type semiconductor package is composed by stacking at least two package units 270. The package unit 270 is composed of the connection terminal 216 formed on the exposed first and second wirings 206a, 206b of the semiconductor chip 200, in addition to the semiconductor chip 200 has the structure as shown in FIG. 2I.

More specifically, a plurality of passive elements 214 and via wirings 212 are located within the semiconductor chip 200, and a first and second wiring 206a, 206b are disposed to connect to the passive element 214 on top and bottom surfaces of the semiconductor chip 200. A first and a second passivation films 208a, 208b are formed on the first and second wirings 206a, 206b in such a way to expose each top surface of the first and second wiring 206a, 206b, and a connection terminal 126 is disposed on the exposed first and second wiring 206a, 206b. The connection terminal 216 is formed with any one of Sn, Ni, Al, Cu, and Au or mixing material thereof.

The stacked package units 270 is stacked such that the connection terminal 216 of a lowermost package unit 270 may correspond to the connection pad 222 on the substrate 220 which is in a position corresponding to the connection terminal 216 of the package unit 270.

The encapsulant 260 is formed to surround the stacked package units 270 on the substrate 220 to protect the stacked package units 270. A solder ball 250 is attached on a bottom surface of the substrate 220 to function as an external connection terminal. Herein, the capping film may be formed only on the package unit 270 disposed on the uppermost unit of the stacked package units 270 instead of the encapsulant 260.

The bonding pad 202, the passivation film 204, the passive element 210, the via wiring 212, the first and the second wiring 206a, 206b, and the first and the second passivation films 208a, 208b composing the package unit 270 are same as a structure of the semiconductor chip described in FIG. 1.

Meanwhile, the stack-type semiconductor package according to the present invention is formed by stacking the semiconductor chip in wafer level and then sawing the stacked chips, or is formed by stacking the semiconductor chips cut via a sawing process.

As described, the present invention can make the semiconductor package more compact by forming the passive element within the semiconductor chip instead of forming the passive element of multi-layer structure in the semiconductor package. Further, the present invention can prevent reliability degradation caused by heat generated during the production procedure. Moreover, the present invention can implement the semiconductor package having optimal electric signal characteristics by embedding the passive element within the semiconductor chip.

Although various embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
    a semiconductor chip being an active device, the semiconductor chip having a plurality of bonding pads formed on a top surface and a plurality of first via holes and at least one second via hole formed on edges thereof;
    a passive element comprising a dielectric material formed within each of the plurality of first via holes such that a top surface and a bottom surface of the dielectric material formed within each of the first via holes are recessed from a top surface and a bottom surface of the semiconductor chip, respectively,
    wherein a thickness the dielectric material formed within each of the plurality of first via holes is the same or different;
    a via wiring formed within the second via hole;
    a first wiring formed on the top surface of the semiconductor chip and on the top surface of the dielectric material formed within each of the first via holes so as to connect to the bonding pad on the top surface of the semiconductor chip at one end and connect to the dielectric material formed within each of the plurality of first via holes and the via wiring on top surfaces thereof;
    a second wiring formed on the bottom surface of the semiconductor chip and on the bottom surface of the dielectric material formed within each of the first via holes so as to connect to the dielectric material formed within each of the plurality of first via holes and the via wiring on bottom surfaces thereof;

a first passivation film formed in such a way to expose one portion of the first wiring on a top surface of the semiconductor chip and to expose the via wiring; and a second passivation film formed in such a way to expose one portion of the second wiring on a bottom surface of the semiconductor chip and the via wiring.

2. The semiconductor package according to claim 1, wherein the second via hole is disposed outward of the plurality of first via holes.

3. The semiconductor package according to claim 2, wherein the passive element formed within each of the plurality of first via holes further comprises respective portions of the first wiring and the second wiring formed on the top surface and the bottom surface of the dielectric material within each of the plurality of first via holes.

4. The semiconductor package according to claim 3, wherein the dielectric material is formed with a single film or at least two laminated films.

5. The semiconductor package according to claim 1, further comprising a connection terminal to contact with the exposed portion of the first wiring within the first passivation film.

6. The semiconductor package according to claim 5, further comprising a substrate attached to the semiconductor chip at the connection terminal.

7. The semiconductor package according to claim 6, further comprising a solder ball attached on a bottom surface of the substrate.

8. The semiconductor package according to claim 6, further comprising a capping film formed on a top portion of the semiconductor chip.

9. A semiconductor package with at least two package units being stacked, wherein the package unit comprises:

a semiconductor chip being an active device, the semiconductor chip having a plurality of bonding pads formed on a top surface and a plurality of first via holes and at least one second via hole formed on edges thereof;

a passive element comprising a dielectric material formed within each of the plurality of first via such that a top surface and a bottom surface of the dielectric material formed within each of the first via holes are recessed from a top surface and a bottom surface of the semiconductor chip, respectively, wherein a thickness the dielectric material formed within each of the plurality of first via holes is the same or different;

a via wiring formed within the second via hole;

a first wiring formed on the top surface of the semiconductor chip and on the top surface of the dielectric material formed within each of the first via holes so as to connect to the bonding pad on the top surface of the semiconductor chip at one end and connect to the dielectric material formed within each of the plurality of first via holes and the via wiring on top surfaces of thereof;

a second wiring formed on the bottom surface of the semiconductor chip on the bottom surface of the dielectric material formed within each of the first via holes so as to connect to the dielectric material formed within each of the plurality of first via holes and the via wiring on bottom surfaces thereof;

a first passivation film formed in such a way to expose one portion of the first wiring on a top surface of the semiconductor chip and to expose the via wiring;

a second passivation film formed in such a way to expose one portion of the second wiring on a bottom surface of the semiconductor chip and to expose the via wiring; and a connection terminal formed on the exposed portions of the first wiring and the second wiring.

10. The semiconductor package according to claim 9, wherein the second via hole is disposed outward of the first via hole.

11. The semiconductor package according to claim 10, wherein the passive element formed within each of the plurality of first via holes further comprises respective portions of the first wiring and second wiring formed on the top surface and the bottom surface of the dielectric material within each of the plurality of first via holes.

12. The semiconductor package according to claim 11, wherein the dielectric material is formed with a single film or at least two laminated films.

13. The semiconductor package according to claim 9, further comprising a substrate attached to the semiconductor chip formed at the connection terminal.

14. The semiconductor package according to claim 13, further comprising a solder ball attached on a bottom surface of the substrate.

15. The semiconductor package according to claim 13, further comprising a capping film formed on a top portion of the semiconductor chip.

16. A semiconductor package comprising:

a semiconductor chip being an active device, the semiconductor chip having a plurality of bonding pads formed on a top surface and a plurality of first via holes and at least one second via hole formed on edges thereof;

a passive element comprising a dielectric material formed within each of the plurality of first via holes such that an upper and lower surface of the dielectric material formed within each of the first via holed are recessed from an upper and lower surface of the semiconductor chip, respectively, a first wiring formed on the top surface of the semiconductor chip, within the second via hole, and on the top surface of the dielectric material formed within each of the first via holes so as to connect to the bonding pad on the top surface of the semiconductor chip at one end;

a second wiring formed on the bottom surface of the semiconductor chip, within the second via hole so as to connect to the first wiring within the second via hole, and on the bottom surface of the dielectric material formed within each of the first via holes;

a via wiring within the second via hole comprising the portions of the first wiring and the second wiring formed within the second via hole;

a first passivation film formed in so as to expose a portion of the first wiring on a top surface of the semiconductor chip and to expose the via wiring; and a second passivation film formed in so as to expose a portion of the second wiring on a bottom surface of the semiconductor chip and the via wiring.

\* \* \* \* \*